United States Patent [19]

Nuyen

[11] Patent Number: 5,827,751
[45] Date of Patent: *Oct. 27, 1998

[54] METHOD OF MAKING SEMICONDUCTOR COMPONENTS, IN PARTICULAR ON GAAS OF INP, WITH THE SUBSTRATE BEING RECOVERED CHEMICALLY

[75] Inventor: Linh T. Nuyen, Paris, France

[73] Assignee: Picogiga Societe Anonyme, Les Ulis, France

[ * ] Notice: The term of this patent shall not extend beyond the expiration date of Pat. No. 5,593,917.

[21] Appl. No.: 609,487

[22] Filed: Mar. 1, 1996

Related U.S. Application Data

[63] Continuation of Ser. No. 271,771, filed as PCT/FR92/01152 Dec. 4, 1992, abandoned.

[30] Foreign Application Priority Data

Dec. 6, 1991 [FR] France ..................................... 9115539

[51] Int. Cl.⁶ ..................................................... H01L 21/20
[52] U.S. Cl. ................................. 438/28; 438/464; 438/67
[58] Field of Search ................................... 437/133, 129, 437/228, 105, 225, 974, 2, 4, 86, 944; 148/DIG. 12, DIG. 135

[56] References Cited

U.S. PATENT DOCUMENTS

| | | | |
|---|---|---|---|
| 4,774,194 | 9/1988 | Hokuyou | 437/5 |
| 4,883,561 | 11/1989 | Gmitter | 156/633 |
| 5,021,099 | 6/1991 | Kim et al. | 136/249 |
| 5,244,818 | 9/1993 | Jokerst | 437/3 |
| 5,458,694 | 10/1995 | Nuyen | 437/5 |
| 5,593,917 | 1/1997 | Nuyen | 437/974 |

FOREIGN PATENT DOCUMENTS

| | | |
|---|---|---|
| 0029334 | 5/1981 | European Pat. Off. . |
| 2593326 | 7/1987 | France . |

OTHER PUBLICATIONS

M. Konagai et al., "High efficiency GaAs thin film solar cells by peeled film technology", Journal of Crystal Growth, vol. 45, 1978, pp. 277–280.

T. Hamaguchi et al., "Device Layer Transfer Technique Using Chemical–Mechanical Polishing", Japanese Journal of applied Physics, vol. 23, No. 10/2, Oct. 1984, pp 815–817.

*Primary Examiner*—John Niebling
*Assistant Examiner*—S. Mulpuri
*Attorney, Agent, or Firm*—Jacobson, Price, Holman & Stern, PLLC

[57] ABSTRACT

The method is characterized by steps consisting in: a) producing a substrate of GaAs or of InP, b) growing epitaxially on said substrate a separating layer of AlGaAs or of AlInAs that is aluminum-rich, c) growing epitaxially on said separating layer an active layer including aluminum-rich material, d) making a set of components by etching and metallization, e) applying a protective layer of a passivation material or of a photosensitive resin, f) selectively etching said protective layer so as to bare the separating layer between the components, g) fixing a common support plate on the assembly so as to hold the components together mechanically, and h) dissolving the material of the separating layer by the chemical action of a solvent on the bared regions, while leaving intact the other materials so as to separate the substrate from the components without dissolving the substrate.

6 Claims, 2 Drawing Sheets

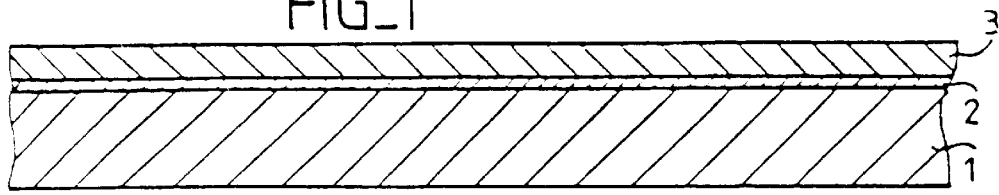
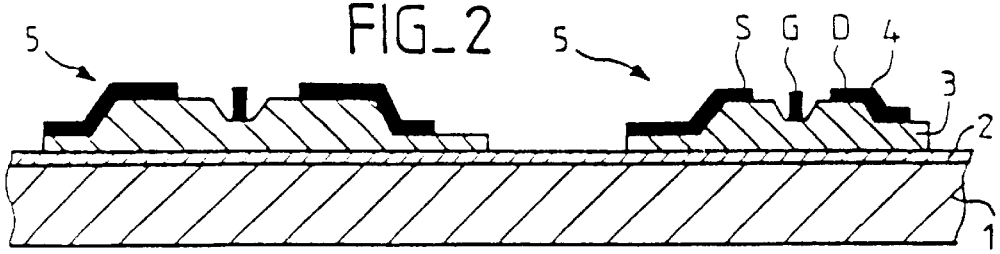
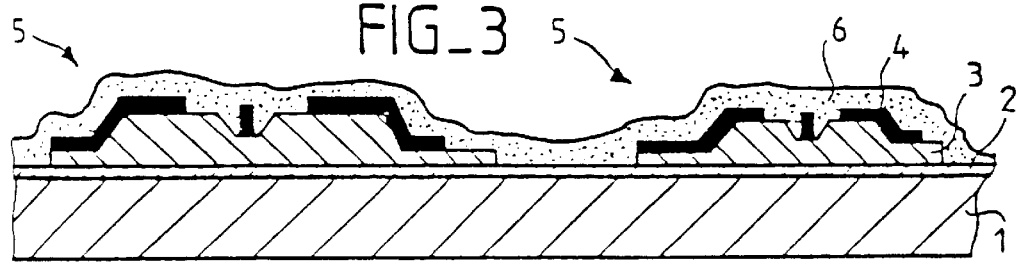
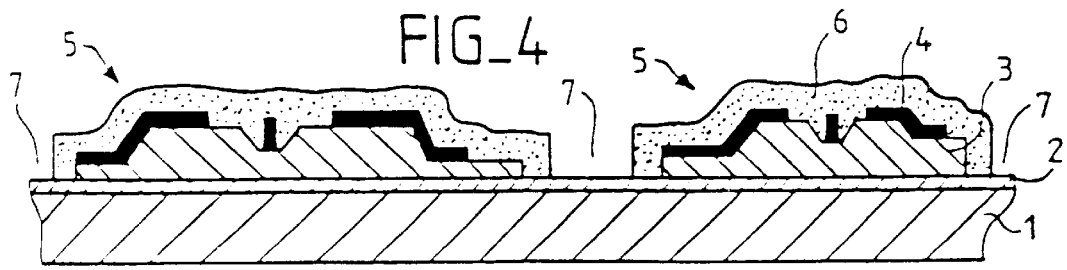
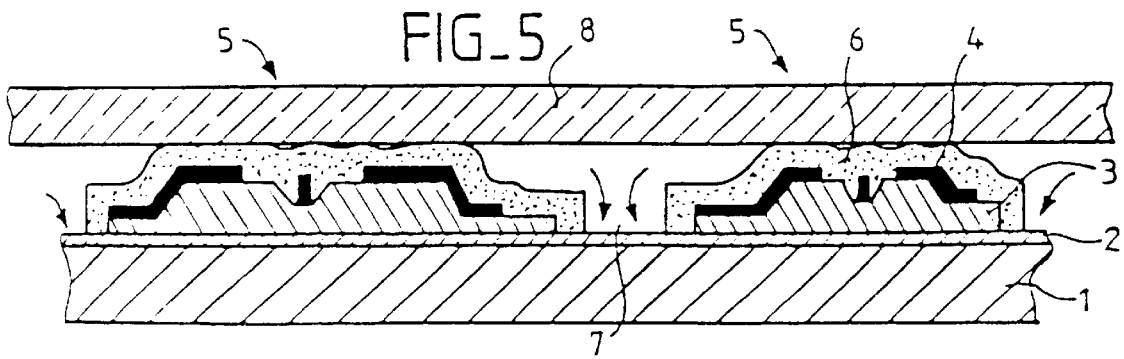

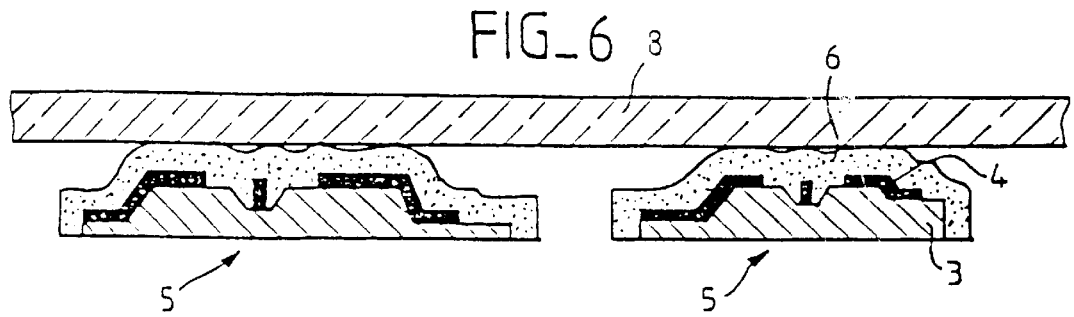
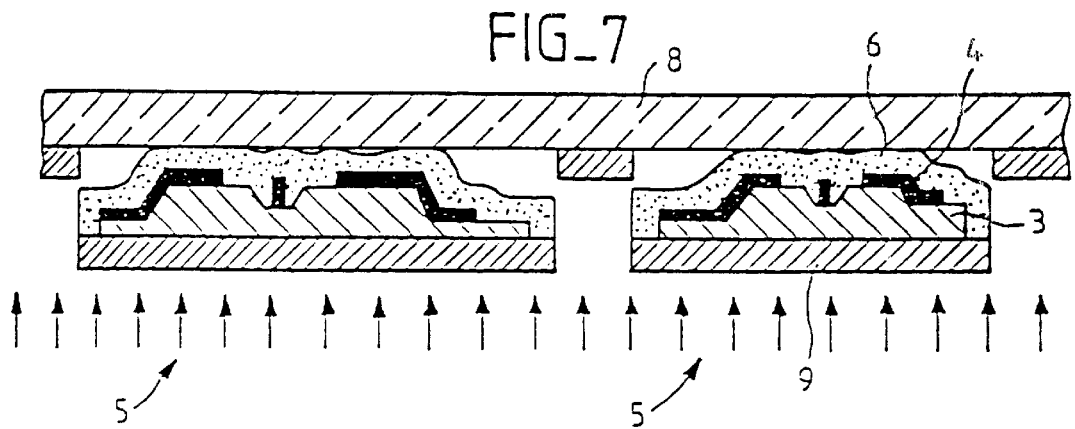
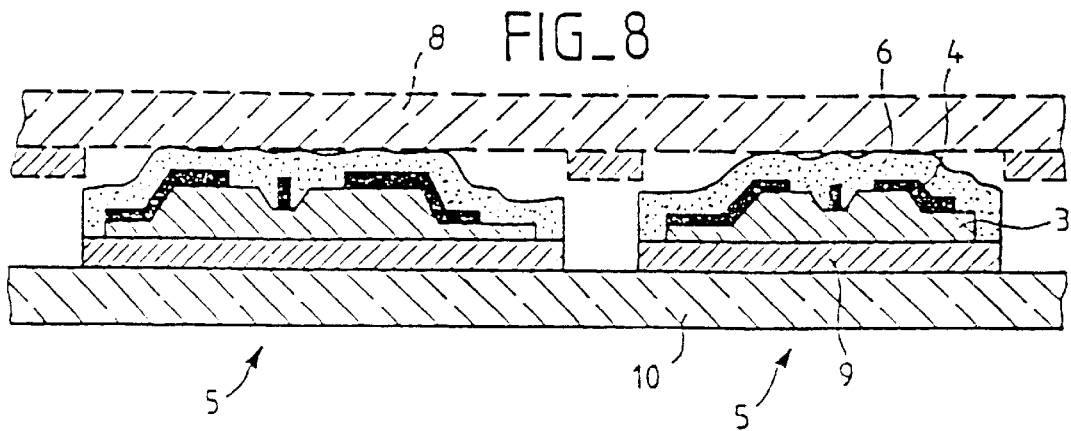
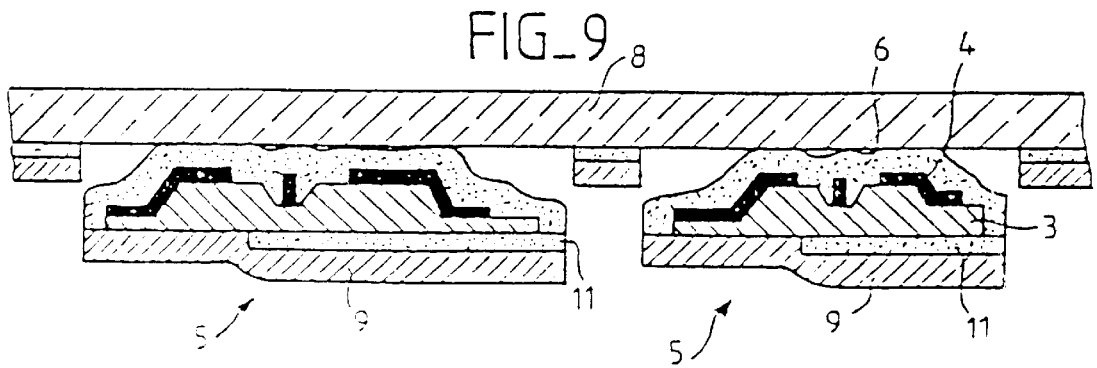

METHOD OF MAKING SEMICONDUCTOR COMPONENTS, IN PARTICULAR ON GAAS OF INP, WITH THE SUBSTRATE BEING RECOVERED CHEMICALLY

This application is a continuation-in-part under 35 USC § 120 and § 365 on PCT application No. PCT/FR92/01152 filed on Dec. 4, 1992.

The invention relates to a method of making an electronic component based on III–V semiconductor materials.

This application is a continuation of application Ser. No. 08/271,771, filed Jun. 6, 1994, now abandoned.

BACKGROUND OF THE INVENTION

It relates more particularly to components made on GaAs or InP substrates, essentially components having $Al_xGa_{1-x}As$ (on GaAs) or $Al_xIn_{1-x}As$ (on InP) as the active layer.

Proposals have already been made to make such electronic components and then to separate them from their GaAs or InP substrates by dissolving a separating $Al_xGa_{1-x}As$ layer having a high aluminum content (molar fraction $X_{Al} \geq 0.50$) previously grown epitaxially between the substrate and the active layers of semiconductor material constituting the electronic component proper. In this respect, reference may be made to M. Konagai et al., *High efficiency GaAs thin film solar cells by peeled film technology*, Journal of Crystal Growth, No. 45 (1978), p. 277, E. Yablonovitch et al., *Extreme selectivity in the lift-off of epitaxial GaAs films*, Appl. Phys. Lett., Vol. 51, No. 26, 28 Dec. 1987, p. 222, or H. Schumacher et al., *High-speed InP/GaInAs photodiode on sapphire substrate*, Electronics Letters, Vol. 25, No. 24, 23 Nov. 1989, p. 1653.

That technique of separating components from the substrate on which they have been made presents a large number of advantages.

Firstly, it makes it possible to reduce the thickness of the component by completely eliminating the substrate, with all the corresponding advantages that result therefrom: since the substrate has been eliminated, there is no longer any need to make vias to pass through the substrate and provide electrical contact with the bottom layer of the component; the manufacturing cost of the component is correspondingly reduced; the weight of the component is considerably reduced, which is advantageous in space applications; in certain optoelectronic applications, the substrate may constitute a hindrance insofar as it is not transparent at the wavelengths concerned; and finally heat dissipation is considerably improved by eliminating the thermal resistance constituted in present components by the presence of the substrate (GaAs and InP are poor conductors of heat).

Secondly, and above all, the method of the invention makes it possible to recover the material of the substrate without destroying it, thereby saving not only the cost of a lapping step, but also the cost of the substrate which can be reused directly.

The technique of separating the substrate by chemical dissolution is based on the fact that the compound $Al_xGa_{1-x}As$ having a high content of aluminum ($X_{Al} \geq 0.50$) and constituting the separating layer dissolves very quickly in hydrochloric or hydrofluoric acid, unlike GaAs or $Al_yGa_{1-y}As$ having a low aluminum content ($Y_{Al} < 0.30$).

Because of the principle on which it is based, that technique is unsuitable for being transposed directly to cases where the active layer of the component proper includes layers that are rich in aluminum such as $Al_yGa_{1-y}As$ (with $Y_{Al} \geq$ about 0.50) on a GaAs substrate, or $Al_yIn_{1-y}As$ (with $Y_{Al} \geq$ about 0.50) on an InP substrate, since these aluminum-rich layers would themselves be subjected to etching by the acids.

As explained in the above-mentioned article by Yablonovitch et al., very high selectivity in etching speed is observed as a function of the composition of the layer, with said speed increasing very sharply once the molar fraction of aluminum exceeds a threshold in the range 40% to 50%.

Proposals have recently been made by A.J. Tsao et al., *Epitaxial liftoff of AlAs/GaAs double barrier resonant tunneling diodes*, Electronics Letters, Vol. 27, No. 6, 14 Mar. 1991, p. 484, to cover the flank of the component with an inert grease, known in the art by the term "Apiezon grease", thereby protecting portions of aluminum-rich layers from etching.

Nevertheless, that technique is difficult to adapt to mass production of electronic components, in particular because of the difficulty of spreading the Apiezon grease appropriately on the flanks of the components; as a result that technique can be envisaged for little other than the circumstances described in the article in question, namely the making of highly specific components that are treated in isolation.

OBJECT AND SUMMARY OF THE INVENTION

The object of the present invention is to propose a method of making components with recovery of the substrate, that is easily controllable, that is suitable for industrialization, and that also makes it possible in highly accurate manner to protect the flanks of components from chemical etching.

To this end, the method of the invention is characterized by the steps consisting in:

producing a substrate of binary or ternary III–V semiconductor material; epitaxially growing on said substrate a separating layer of ternary III–V semiconductor material having a molar fraction of aluminum of at least 40% and an atomic lattice compatible with that of the substrate; epitaxially growing on said separating layer an active layer of binary or ternary III–V semiconductor material having an aluminum molar fraction of at least 30% and an atomic lattice compatible with that of the separating layer; making a set of semiconductor components by etching and metallizing said active layer; applying a protective layer of a passivation material or of a photosensitive resin on said set of components; etching said protective layer so as to bare the separating layer between said components or between groups of said components; fixing a common support plate on the assembly made in this way, thereby holding the components together mechanically; and dissolving the material of the separating layer by chemical action on the bared regions, while leaving the other materials intact so as to separate the substrate from the components or groups of components without dissolving the substrate.

It is also possible to provide a final step consisting in depositing metallization on the rear face of the active layer of components or groups of components, which rear face has been uncovered by removal of the substrate, and/or separating the various individual components or groups of components from said common support plate; in either case, it is possible to provide for the various individual components or groups of components to be fixed on a common support member, on its rear face. Said common support plate and/or, where appropriate, said common support member may, if necessary, carry component interconnection lines and/or, possibly be optically transparent when the components are optoelectronic components.

BRIEF DESCRIPTION OF THE DRAWINGS

An implementation of the invention is described below with reference to the accompanying drawings, in which FIGS. 1 to 9 are diagrammatic figures showing the various steps in making a component in the method of the invention.

The component shown in the figures is naturally given purely by way of example, and could equally well be a component of another type or having a different configuration.

DETAILED DESCRIPTION OF THE INVENTION

FIG. 1 shows the layers of the starting wafer that comprises a substrate 1 which is thick (typically having a thickness of about 500 micrometers) and that is made of GaAs or of InP, on which a separating layer 2 of $Al_xGa_{1-x}As$ having a high aluminum content and very small thickness (e.g. of the order of a few tens of nanometers) is grown by epitaxy. Thereafter, a layer 3 is grown epitaxially on the separating layer 2, with the doping, the thickness, and the composition of the layer 3 being selected as a function of the component to be made.

This active layer 3 is generally constituted by a stack of successive layers each of differing composition, doping, and thickness, so the term "active layer" is used herein to designate such a stack collectively.

The invention relates to the case where said active layer 3, like the separating layer 2, includes a material having a high aluminum content, e.g. $Al_yGa_{1-y}As$ with $y_{Al} \geq 0.50$ or $Al_yIn_{1-y}As$ with $y_{Al} \geq 0.50$.

In the step shown in FIG. 2, various known method steps have been performed on the active layer 3 involving chemical, ion-beam, or reactive ion-beam etching, depositing a layer of metallization 4, etc., so as to make up various individual components 5 having source, grid, and drain electrodes S, G, and D respectively. It will be observed that it is equally possible to make components that are separate (individual transistors) or that are in groups which may correspond to a given logic or analog function, with the various elementary components in such groups of components then being made in a common region of the active layer 3 and being interconnected by appropriate metallization.

In the step of FIG. 3, which step is characteristic of the invention, all of the components have been covered in a protective layer 6 of an inert material, which material may be constituted, in particular, by a photosensitive resin or by a component passivation layer (an oxide or nitride layer) deposited in conventional manner.

In the step of FIG. 4, the protective layer 6 has been etched so as to bare the aluminum-rich separating layer 2 in regions marked 7 while still protecting the flanks of the components or groups of components which are then in the form of mutually isolated islands on the substrate. These openings 7 are made by conventional photolithographic or electron-beam lithographic techniques if the protective layer is constituted by a photosensitive resin, or by etching if it is constituted by a passivation layer.

In the step of FIG. 5, all of the components have been covered by a common plate 8, e.g. glued onto the protective layer 6 after it has been deposited. For reasons explained below, the adhesive used is selected to be non-soluble in acid.

Once the plate 8 has been glued into place, the assembly constituted by the plate plus the etched wafer is dipped in a bath of dilute acid, e.g. 50% hydrochloric acid, the choice of acid not being limiting in any way.

The effect of this operation is to etch the aluminum-rich layer 2, with the acid penetrating through the interstices formed between the components and etching the $Al_xGa_{1-x}As$ layer at the bared regions 7 and then edgewise through the layer, as illustrated by the arrows in FIG. 5. The remainder of the structure, in particular the GaAs or InP substrate, the regions protected by the inert layer 6, the support plate 8, and the adhesive connecting it to the components are, in contrast, left intact.

Naturally, the material constituting the bottom face of the active layer 3, i.e. the face which is in contact with the separating layer 2 has low aluminum content since otherwise the components would be etched from beneath during dissolution of the separating layer 2. This material is generally a layer of GaAs, InP, or $Al_xIn_{1-x}As$, with the aluminum-rich layers of $Al_xGa_{1-x}As$ being situated higher up in the stack of layers constituting the active layer 3.

Thus, if an epitaxial layer of $Al_xGa_{1-x}As$ is made that is several tens of nanometers thick, for example, overnight immersion in HCl diluted to 50% shows that said material is completely etched away over the surface of a wafer having a diameter of 2 inches (about 5 cm), the GaAs substrate detaching itself from the components. The wafer of substrate detached in this way and which has not been etched by the acid, is entirely reusable for making other components on the same wafer.

The situation shown in FIG. 6 is thus achieved.

In FIG. 7, the process is continued by depositing metallization 9 on the free face, i.e. the rear face of the doped layer 3. The metallization 9 may be deposited by any conventional method (evaporation, etc.), thereby enabling direct contact to be made with the rear face of the doped layer without the substrate being separating, and thus without any need to form vias; in addition, because of this direct contact, the metallization also acts effectively as a heat sink.

Operations may continue in various different ways.

Firstly, it is possible to dissolve the adhesive so as to separate the support plate 8 from the individual components 5 or groups of components, thereby enabling the various chips to be recovered.

Before dissolving the adhesive, it is also possible to fix the set of components on a "drum skin" in conventional manner, thereby enabling the various chips to be held and separated more easily after the adhesive has been dissolved.

In addition, for certain applications, such as solar cells or light-emitting diodes (LEDs), it may be preferable to leave the plate glued in place so as to have an array of components that are electrically interconnected (either via the plate itself or else in some other manner). It is thus possible to make large-sized LED panels directly, the plate 8 then being a transparent plate of appropriate organic or inorganic material.

Once the array has been made, it is also possible to glue the components via their bottom faces onto another support plate 10, as shown in FIG. 8, thereby obtaining a "sandwich" structure that may be light-emitting or photosensitive, and that is made up of an array of diodes held between two protective and supporting plates 8 and 10.

After gluing to the rear plate 10, it is also possible to separate the front plate 8, in which case it serves only as a temporary support before transferring the components onto the final support plate 10.

Furthermore, the support plate may itself be an active component.

Also, as shown in FIG. 9, it is possible to deposit an insulating layer 11 over the drain electrode of the transistor prior to the metallization step so as to reduce the stray capacitance that could result from said electrode being too close to the metallization on the rear face (since the substrate is now absent).

I claim:

1. A method of making semiconductor components, comprising the following steps:
   a) producing a substrate of binary or ternary III–V semiconductor material that is not dissolvable by a chemical action;
   b) epitaxially growing on said substrate a separating layer of ternary III–V semiconductor material having a molar fraction of aluminum of at least 40% and an atomic lattice compatible with that of the substrate that is dissolvable by the chemical action;
   c) epitaxially growing on said separating layer an active layer of binary III–V semiconductor material or ternary III–V semiconductor material having an aluminum molar fraction of at least 300%, said active layer having an atomic lattice compatible with that of the separating layer;
   d) making a set of semiconductor components by etching and metallizing said active layer, which exposes areas of the separating layer;
   e) applying a protective layer of a material resistant to the chemical action on said set of components and said exposed areas;
   f) etching said protective layer so as to bare the separating layer in areas between said components or between groups of said components to form an assembly;
   g) fixing a common support plate on the assembly, thereby holding the components together mechanically; and
   h) dissolving the separating layer by the chemical action, which frees, but does not dissolve, the substrate.

2. The method of claim 1, further including a step of:
   i) depositing metallization on the rear face of the active layer of the components or groups of components, which rear face has been uncovered by removal of the substrate.

3. The method of claim 2, further including a step of:
   j) separating the components or groups of components from said common support plate.

4. The method according to claim 3, further including a step of:
   k) fixing the rear faces of the components or groups of components on a common support member.

5. The method of claim 4, wherein said common support plate, said common support member, or both carry component interconnection lines.

6. The method of claim 4, wherein said common support plate, said common support member, or both is optically transparent and the components are optoelectronic components.

* * * * *